United States Patent [19]
Nath et al.

[11] Patent Number: 5,637,537
[45] Date of Patent: Jun. 10, 1997

[54] METHOD OF SEVERING A THIN FILM SEMICONDUCTOR DEVICE

[75] Inventors: Prem Nath, Rochester Hills; Craig N. Vogeli, New Baltimore, both of Mich.

[73] Assignee: United Solar Systems Corporation, Troy, Mich.

[21] Appl. No.: 881,345

[22] Filed: May 11, 1992

Related U.S. Application Data

[62] Division of Ser. No. 724,543, Jun. 27, 1991, abandoned.

[51] Int. Cl.⁶ .................. H01L 21/302; H01L 21/463
[52] U.S. Cl. .................. 438/460; 148/DIG. 28
[58] Field of Search .................. 437/2, 226, 225; 148/DIG. 28

[56] References Cited

U.S. PATENT DOCUMENTS

| | | | |
|---|---|---|---|
| 4,217,374 | 8/1980 | Ovshinsky et al. | 427/39 |
| 4,226,898 | 10/1980 | Ovshinsky et al. | 427/39 |
| 4,419,530 | 12/1983 | Nath | 136/251 |
| 4,485,264 | 11/1984 | Izu et al. | 136/244 |
| 4,492,181 | 1/1985 | Ovshinsky | 118/718 |
| 4,517,223 | 5/1985 | Ovshinsky et al. | 427/39 |
| 4,704,369 | 11/1987 | Nath et al. | 437/226 |
| 4,891,330 | 1/1990 | Guha et al. | 437/2 |
| 4,940,495 | 7/1990 | Weber et al. | 136/256 |
| 4,965,655 | 10/1990 | Grimner et al. | 357/71 |

*Primary Examiner*—Jey Tsai
*Attorney, Agent, or Firm*—Gifford, Krass, Groh, Sprinkle, Patmore, Anderson & Citkowski, P.C.

[57] ABSTRACT

A method of severing a thin film semiconductor device. The semiconductor device includes a substrate having a first electrode region formed thereon, a semiconductor body formed of layers of thin film semiconductor alloy material disposed upon the base electrode, a transparent, electrically conductive second electrode deposited atop the semiconductor body, and a containment layer of polymeric material associated with the first or second electrode in at least one region to permit subsequent severing of the device into a plurality of devices through said containment layer region.

4 Claims, 2 Drawing Sheets

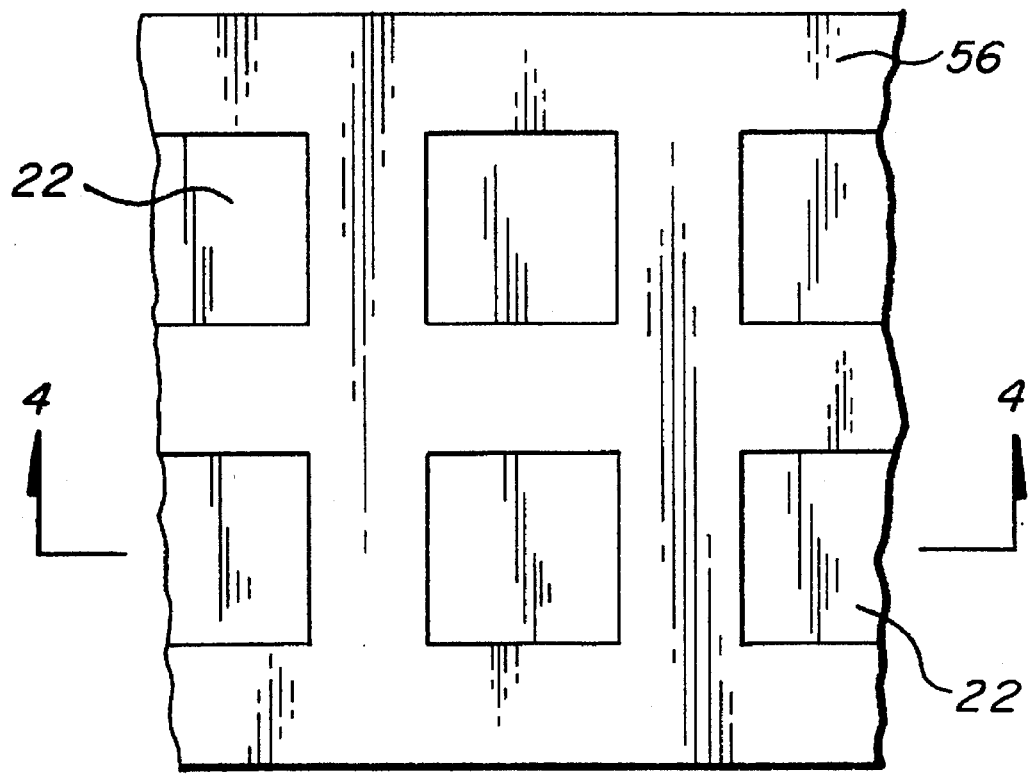
FIG-3
FIG-4
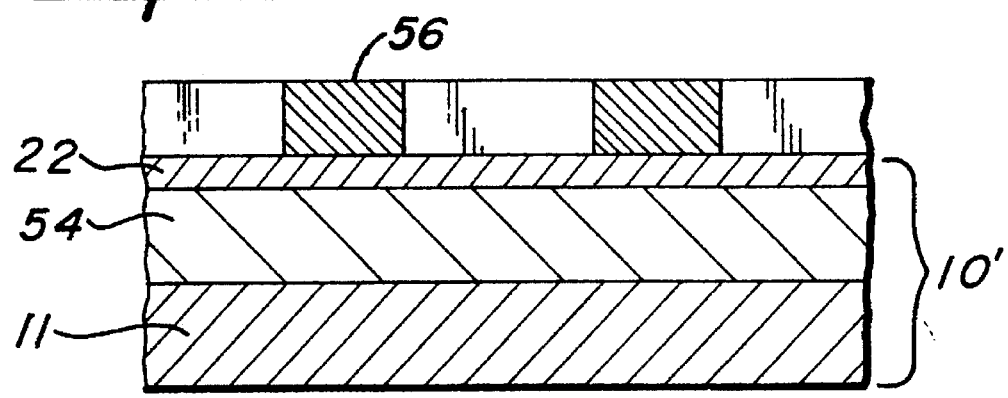

METHOD OF SEVERING A THIN FILM SEMICONDUCTOR DEVICE

REFERENCE TO RELATED APPLICATION

This application is a divisional application of Ser. No. 724,543, filed Jun. 27, 1991, now abandoned.

FIELD OF THE INVENTION

This invention relates generally to large area semiconductor devices, such as photovoltaic devices, and particularly to such a device which is readily severable into smaller portions. Also included within the scope of the instant invention is a method for severing such a device.

BACKGROUND OF THE INVENTION

Single crystal photovoltaic devices, especially silicon photovoltaic devices have been utilized for some time as sources of electrical power because they are inherently non-polluting, silent and consume no expendable natural resources in their operation. However, the utility of such devices is limited by problems associated with the manufacture thereof. More particularly, single crystal materials (1) are difficult to produce in sizes substantially larger than several inches in diameter; (2) are thicker and heavier than their thin film counterparts; and (3) are expensive and time consuming to fabricate.

Recently, considerable efforts have been made to develop processes for depositing amorphous semiconductor films, each of which can encompass relatively large areas, and which can be doped to form p-type and n-type materials for the production of p-i-n type devices substantially equivalent to those formed by their crystalline counterparts. It is to be noted that the term "amorphous" as used herein, includes all materials or alloys which have long range disorder, although they may have short or intermediate range order or even contain, at times, crystalline inclusions. As used herein, the term "microcrystalline" is defined as a unique class of said amorphous material characterized by a volume fraction of inclusions being greater than a threshold value at which the onset of substantial changes in certain key parameters, such as band gap, electrical conductivity and absorption constant, occurs. It is to be noted that pursuant to the foregoing definitions, a microcrystalline semiconductor alloy falls within the generic term "amorphous."

For many years, such work with amorphous silicon or germanium films was substantially unproductive because of the presence therein of microvoids and dangling bonds which produce a high density of localized states in the energy gap, which states are derogatory to the electrical properties of such films. Initially, the reduction of the localized states was accomplished by glow discharge deposition of amorphous silicon ($SiH_4$) gas is passed through a reaction tube where the gas is decomposed by a radio frequency (r.f.) glow discharge and deposited on a substrate maintained at a temperature of about 500–600 degrees K (227°–327° degrees C.). The material so deposited on the substrate is an intrinsic amorphus material consisting of silicon and hydrogen. To produce a doped amorphous material, an N-dopant such as phosphine gas ($PH_3$), or a P-dopant such as diborane ($B_2H_6$) gas, is premixed with the silane gas and passed through the glow discharge reaction tube under the same operating conditions. The materials so deposited include supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to substantially reduce the density of the localizes states in the energy gap, thereby causing the amorphous material to more nearly approximate the corresponding crystalline material.

It is now possible to prepare by glow discharge or vapor deposition thin film amorphous silicon or germanium alloys in large areas, said alloys possessing acceptable concentrations of localized states in the energy gaps thereof and high quality electronic properties. Suitable techniques are fully described in U.S. Pat. No. 4,226,898, entitled "Amorphous Semiconductor Equivalent to Crystalline Semiconductors," of Stanford R. Ovshinsky and Arun Madan which issued Oct. 7, 1980, in U.S. Pat. No. 4,217,374, under the same title to Stanford R. Ovshinsky and Masatsugu Izu, which issued on Aug. 12, 1980, and U.S. Pat. No. of Stanford R. Ovshinsky, David D. Allred, Lee Walter and Stephen J. Hudgens entitled "Method of Making Amorphous Semiconductor Alloys and Devices Using Microwave Energy." As disclosed in these patents, it is believed that compensating agents such as fluorine and/or hydrogen introduced into the amorphus semiconductor operate to substantially reduce the density of the localized states therein and facilitate the addition of other alloying materials.

Since amorphous alloys may be readily deposited atop a wide variety of substrates and over large areas, it is now possible to readily fabricate multiple cell stacked photovoltaic structures. The concept of utilizing multiple cells, to enhance photovoltaic device efficiency was discussed at least as early as 1955 by E. D. Jackson, in U.S. Pat. No. 2,949,498, issued Aug. 16, 1960. The multiple cell structures therein disclosed utilized p-n junction crystalline semiconductor devices. Essentially, the concept is directed to utilizing different band gap devices to more efficiently collect various portions of the solar spectrum and to increase open circuit voltage (Voc.). The tandem cell device has two or more cells with a light directed serially through each cell, with a large band gap material followed by a smaller band gap material to absorb the light passed through the first cell or layer. By substantially matching the generated currents from each cell, the overall open circuit voltage is the sum of the open circuit voltage of each cell while the short circuit current remains substantially constant. It should be noted that Jackson employed crystalline semiconductor materials for the fabrication of the stacked cell device; however, it is virtually impossible to match lattice constants of differing crystalline materials. Therefore, it is not possible to fabricate such crystalline tandem structures in a commercially feasible manner. However, tandem structures can be economically fabricated in large areas by employing amorphous materials.

It is of obvious commercial importance to be able to mass produce photovoltaic devices such as solar cells. However, with crystalline cells, mass production was limited to batch processing techniques by the inherent growth requirements of the crystals. Unlike crystalline silicon, amorphous silicon alloys can be deposited in multiple layers over large area substrates to form solar cells in a high volume, continuous processing system. Such continuous processing systems are disclosed in the following U.S. patents: U.S. Pat. No. 4,400,409 for "A Method of Making P-Doped Silicon Films and Devices Made Therefrom"; U.S. Pat. No. 4,410,588, for "Continuous Amorphous Solar Cell Deposition and Isolation System and Method"; U.S. Pat. No. 4,542,711, for "Continuous System for Depositing Amorphous Semiconductor Material"; U.S. Pat. No. 4,492,181, for "Method and Apparatus for Continuously Producing Tandem Amorphous Photovoltaic Cells"; and U.S. Pat. No. 4,410,558 for "Continuous Amorphous Solar Cell Production System." As disclosed in these patents, a substrate may be continuously advanced through a succession of deposition chambers, wherein each chamber is dedicated to the deposition of a specific semiconductor material. In making a solar cell of p-i-n type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy.

Since each deposited semiconductor alloy, and especially the intrinsic semiconductor alloy, must be of high purity: (1) the deposition environment in the intrinsic deposition chamber to prevent the diffusion of doping constituents into the intrinsic chamber; (2) the substrate is carefully cleansed prior to initiation of the deposition process to remove contaminants; (3) all of the chambers which combine to form the deposition apparatus are sealed and leak checked to prevent the influx of environmental contaminants; (4) the deposition apparatus is pumped down and flushed with a sweep gas to remove contaminants from the interior walls thereof; and (5) only the purest reaction gases are employed to form the deposited semiconductor materials. In other words, every possible precaution is taken to insure that the sanctity of the vacuum envelope formed by the various chambers of the deposition apparatus remains uncontaminated by impurities, regardless of origin.

The layers of semiconductor material thus deposited in the vacuum envelope of the deposition apparatus may be utilized to form a wide variety of photovoltaic devices including one or more n-i-p cells, one or more p-i-n cells, a Schottky barrier device, photodials, phototransistors, or the like. Additionally, by making multiple passes through the succession of deposition chambers, or by providing an additional array of deposition chambers, multiple stacked cells of various configurations may be obtained.

While in some cases it is desirable to utilize the thus produced photovoltaic material in the form of a large area device, in other cases it is necessary to cut or sever large area photovoltaic material into smaller photovoltaic cells. It should be noted at this point that the term "severing" as used herein is meant to include cutting, shearing, punching, die cutting, slitting or any other process which penetrates the semiconductor device. Such smaller area cells have utility in consumer applications such as power sources for calculators, watches, toys and small electrical appliances. Also, if a roll-to-roll process is utilized for the continuous production of photovoltaic devices, it is necessary to sever that roll to produce discrete photovoltaic cells. And, if it is desired to produce large area power generation modules from the photovoltaic material, it is necessary to cut that material into smaller portions which will subsequently be electrically interconnected. The invention includes a method for severing a large area solar cell into smaller portions without causing the short circuiting thereof.

The typical thin film photovoltaic cell will be described in greater detail hereinbelow; however, such a cell includes a substrate, which forms the base electrode or has a base electrode region thereupon, a semiconductor body deposited atop the base electrode and a relatively transparent electrically conductive top electrode member. Top electrode members are generally formed of a transparent oxide material such as indium tin oxide, tin oxide, indium oxide, cadmium stannate and zinc oxide.

Problems are encountered in severing a photovoltaic cell of this type because the cutting process tends to produce one or more short circuit current paths which establish electrical communication between the top electrode and the base electrode of the photovoltaic device. It has generally been found by applicants that the transparent conductive oxide material is relatively brittle and tends to form a plurality of shards when subjected to a shearing force in the cutting process. These shards penetrate through or bridge across the semiconductor body and establish a short circuit current path between the remainder of the top electrode material and the electrically conductive base electrode. Obviously, the shorted photovoltaic cell is of no practical utility.

Several approaches to this problem have heretofore been implemented so as to allow for severing of the large area photovoltaic material. However, these processes are time and labor intensive and tend to waste photovoltaic material. For example, as disclosed in U.S. Pat. No. 4,419,530 entitled "Solar Cell and Method for Producing Same," various "scribing" methods may be utilized to remove portions of the transparent conductive oxide layer from the photovoltaic cell in regions which are to be cut. In this manner, the problem of short circuiting by the shards is obviated. Among the scribing techniques are (a) chemical etching techniques, (b) plasma etching techniques, (c) laser scribing techniques, (d) water jet techniques and (e) the use of masking techniques during the deposition of the transparent conductive oxide top electrode layer. While all of these techniques do work, they necessitate extra processing steps, and in some cases rely upon the use of bulky and/or expensive additional hardware.

As disclosed in U.S. Pat. No. 4,485,264 entitled "Isolation Layer for Photovoltaic Device and Method of Producing Same," the semiconductor body of a photovoltaic cell may be provided with TCO free regions by first forming a pattern of relatively thick, electrically insulating silicone material thereupon prior to the deposition to the TCO layer. The thick insulating layer prevents the formation of a continuous TCO layer thereacross and thus provides electrically isolated regions in which severing may take place without the creation of short circuit current paths. As in the previously described technique, this process requires fairly precise alignment and necessitates extra steps in the processing in the photovoltaic cells.

U.S. Pat. No. 4,704,369 entitled "Method of Severing a Semiconductor Device," discloses a method of cutting such device including a substrate having a base electrode region thereupon, a semiconductor body disposed upon the base electrode, and a transparent, electrically conductive top electrode deposited atop the semiconductor body. The method disclosed in this patent includes the steps of: providing means for supporting the top electrode side of the semiconductor device; disposing shearing means proximate the substrate side of the semiconductor device, and activating the shearing means so as to apply a shearing force to the device from the substrate side thereof. In one embodiment disclosed in the referenced patent, a protective member such as a sheet of cardboard, paper or synthetic polymer may optionally be disposed between the top electrode side of the semiconductor device and the support means so as to prevent damage to the top electrode during the cutting. However, since the patented method performs the severing operation upon the semiconductor device from the substrate side thereof, a specially designed and constructed die-cutting station, a version of which is disclosed in the patent, must be utilized to perform the patented method.

Clearly then, it is highly desirable to have a technique for severing semiconductor material, particularly large area photovoltaic devices, into small area photovoltaic cells without producing short circuits therein. This technique should not require the use of any complicated or extraneous hardware, nor should it impose any additional process steps on the fabrication of the semiconductor material.

These and other advantages of the instant invention will be more fully detailed and explained by the drawings, the description thereof and the claims which follow.

SUMMARY OF THE INVENTION

Disclosed and claimed herein is a readily severable semiconductor device, such as a photovoltaic device, and method of manufacturing such a device. The readily severable semiconductor device comprises: a substrate having a first, base electrode region formed thereupon; a semiconductor body formed of layers of thin film semiconductor alloy material disposed upon the base electrode; a second, transparent, electrically conductive top electrode formed of a transparent, conductive oxide material disposed atop the semiconductor body; and a containment layer formed of polymeric material associated with one of the electrodes in at least one region to permit the device to be severed through such region to form a plurality of devices. The polymeric containment layer may be disposed atop the top electrode. It may be disposed thereon in a plurality of regions to permit the device to be repeatedly severed into a plurality of devices. That is, the regions of the containment layer will form a pattern for subsequent severing of the device.

Due to the protective action of the containment layer, the device may be severed from either electrode side in a conventional manner without establishing short circuit contact between the substrate electrode and the electrode. It has been found that, if a containment layer approximately 10 microns thick is deposited on the top electrode, it will serve to cushion the brittle, top electrode while it is being severed, thus preventing the electrode from forming shards, which lead to short circuiting, while the severing operation is being performed.

The instant invention also provides a method of manufacturing a large area semiconductor device which is readily severable into a plurality of smaller devices. The method includes the steps of: providing a substrate having a base electrode region formed thereupon; successively depositing layers of thin film semiconductor alloy material upon said base electrode to form a semiconductor body; depositing a transparent, electrically conductive top electrode formed of a relatively brittle, transparent conductive oxide material atop the semiconductor body; and depositing a containment layer formed of a polymeric material atop the top electrode in at least one region thereof to permit subsequent severing of said device into a plurality of smaller devices through said region.

BRIEF DESCRIPTION OF THE DRAWINGS

FIG. 3 is a plan view of a photovoltaic cell constructed according to the present invention which is readily severable into smaller cells; and FIG. 4 is a cross-sectional view of the cell of FIG. 3.

DETAILED DESCRIPTION OF THE PREFERRED EMBODIMENTS

I. The Photovoltaic Cell

Figure 1:
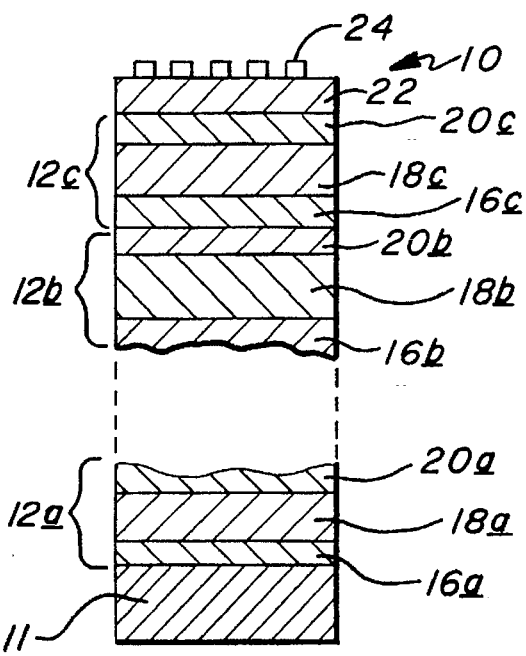
FIG. 1 is a fragmentary, cross-sectional view of a tandem photovoltaic device of the type which may be employed in the practice of the instant invention, and comprising a plurality of n-i-p type photovoltaic cells.

Referring now to the drawings and particularly to FIG. 1, a photovoltaic cell, formed of a plurality of successive n-i-p layers, each of which includes, preferably, an amorphous thin film semiconductor alloy material, is shown generally by the reference numeral 10.

More particularly, FIG. 1 shows an n-i-p type photovoltaic device such as a solar cell made up of individual n-i-p type cells 12a, 12b and 12c. Below the lowermost cell 12a is a substrate 11 which may be formed of a transparent, flexible, synthetic polymeric member; or formed from a metallic material such as stainless steel, aluminum, tantalum, molybdenum, chrome; or formed from metallic particles embedded within an insulator. Although certain applications may require deposition of a thin oxide layer and/or a series of base contacts prior to the deposition of semiconductor alloy material, the term "substrate" shall include not only a flexible film, but also any elements added thereto by preliminary processing. Also included within the scope of the present invention are substrates formed of synthetic polymer to which one or more conductive base electrodes are applied.

Each of the cells 12a, 12b and 12c is preferably fabricated with a thin film semiconductor body containing at least a silicon or silicon/germanium alloy. Each of the semiconductor bodies includes a p-type conductivity layer 20a, 20b and 20c; a substantially intrinsic semiconductor layer 18a, 18b and 18c; and an n-type conductivity semiconductor layer 16a, 16b and 16c. Note that the intrinsic layer may include traces of n-type or p-type dopant material without forfeiting its characteristic neutrality; hence it may be referred to herein as a "substantially intrinsic layer." As illustrated, cell 12b is an intermediate cell and, as indicated in FIG. 1, additional intermediate cells may be stacked atop the illustrated cells without departing from the spirit or scope of the present invention. Similarly, the tandem cell may include only two stacked cells. Also, although n-i-p photovoltaic cells are illustrated, this invention may be advantageously practices with differently configured photovoltaic cells including single or multiple p-i-n cells, Schottky barrier cells, p-n cells, as well as with any other semiconductor device having an appropriate top electrode. The term"n-i-p" type as used herein is meant to include any aggregation of n, i and p layers operatively disposed to provide a photoactive region for generating charge carriers in response to the absorption of photo energy.

It is to be understood that following the deposition of the semiconductor alloy layers, a further deposition process may be either performed in a separate environment or as a part of a continuous process. In this step, a TCO (transparent conductive oxide) layer 22, preferably formed of a material such as tin oxide, indium oxide, indium tin oxide, zinc oxide, cadmium stannate or combinations thereof, is a added stop the p-layer 20c of the top most cell 12c, to function as the top electrode of the cell 10. An electrode grid 24 may be added to the device where the cell is of a sufficiently large area, or if the conductivity of the TCO layer 22 is insufficient to assume efficient collection of photogenerated current. The grid 24 is adapted to shorten the carrier path and increase the conduction efficiency. As discussed previously, the intrinsic layers 18a, 18b and 18c of the cells 12a, 12b and 12c may be formed from alloy materials having different band-gaps. For example, 18c may have a band gap of approximately 1.7 eV, 18b may have a band gap of approximately 1.5eV and 18a may have a band gap approximately 1.3 eV. In this manner, most efficient use may be made of a large portion of the incident solar spectrum.

II. The Multiple Glow Discharge Deposition Chambers

Figure 2:
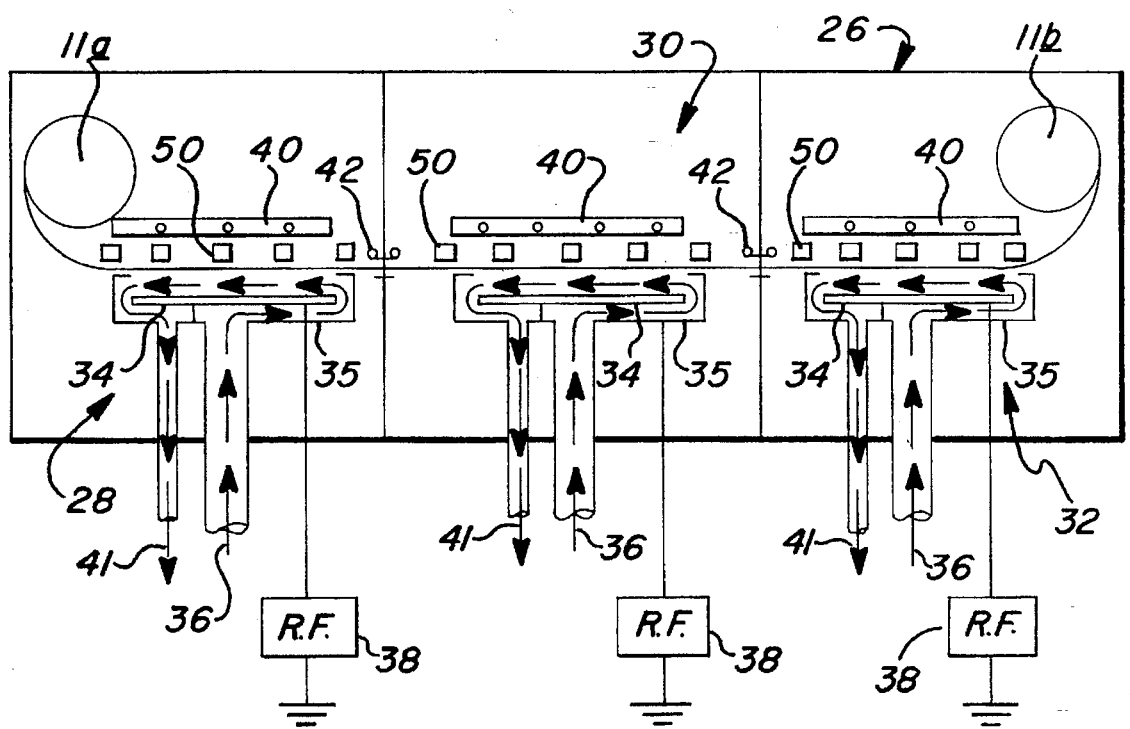
FIG. 2 us a schematic view of a multiple chamber deposition apparatus of the type which may be employed for the fabrication of the tandem photovoltaic cell of FIG. 1.

Turning now to FIG. 2, a diagrammatic representation of multiple glow discharge chamber deposition apparatus for the continuous production of semiconductor cells is generally illustrated by the reference numeral 26. The apparatus 26 includes a plurality of isolated, dedicated deposition chambers, each chamber of which is interconnected by a gas gate 42 through which (1) sweep gases, and (2) a web of substrate material 11 unidirectionally passes. It is in an apparatus of this type that photovoltaic cells similar to the cell 10 of FIG. 1 may be readily manufactured.

The apparatus 26 is adapted to mass deposit amorphous semiconductor layers of n-i-p configuration onto the surface of the web of substrate material 11 which is continually fed therethrough. To deposit the semiconductor layers required for producing multiple n-i-p type cells, the apparatus 26 includes at least one triad of deposition chambers. Each triad of deposition chambers comprises: a first deposition chamber 28 in which an n-type conductivity semiconductor layer is deposited onto the deposition surface of the substrate 11 as the substrate 11 passes therethrough; a second deposition chamber 30 in which an intrinsic semiconductor layer is deposited atop the p-type layer on the deposition surface of the substrate 11 as the substrate 11 passes therethrough; and a third deposition chamber 32 in which a p-type semiconductor layer is deposited atop the intrinsic layer on the deposition surface of the substrate 11 as the substrate 11 passes therethrough. It should be apparent that: (1) although only one triad of deposition chambers has been illustrated, additional triads or additional individual chambers may be added to the apparatus to provide the machine with the capability of producing photovoltaic cells having any number of n-i-p type semiconductor layers; (2) the substrate supply core 11a and the substrate take-up core 11b are shown in the deposition chambers for illustrative purposes only, while in reality the cores would be housed in separate chambers operatively connected to the deposition chambers; (3) although the glow discharge illustrated herein employs cathodes with r.f. power, other energy supplies such as a.c. power generators, microwave generators and d.c. power generators, may be employed without departing from the spirit of the present invention; and (4) the gaseous precursor source of semiconductor alloy material may be introduced to flow in a direction transverse, parallel or parallel but opposite to the direction of substrate travel.

Each deposition chamber 28, 30 and 32 of the triad is adapted to deposit a single semiconductor layer by glow discharge deposition onto the electrically conductive substrate 11. To that end, each of the deposition chambers 28, 30 and 32 includes: a cathode 34; a process gas supply conduit 36; a radio frequency generator or other source of electromagnetic power 38; a process gas and plasma evacuation conduit 41; a plurality of transversely extending magnetic elements 50; a plurality of radiant heating elements shown schematically as 40 in FIG. 2; and a gas gate 42 operatively interconnecting the intrinsic deposition chamber to each adjacent dopant chamber.

The supply conduits 36 are operatively associated with the respective cathodes 34 or other decomposition mechanism to deliver process gas mixtures to the plasma or other decomposition regions created in each deposition chamber between said decomposition mechanism and the substrate 11. The cathode shields 35 are adapted to operate in conjunction with the web of substrate material 11 and the evacuation conduit 41 to confine the process gases within the cathode region of the deposition chambers.

The radio frequency or other similar type of power generator 38 operates in conjunction with the cathodes 34, the radiant heaters 40 and the grounded substrate 11 to form the plasma by disassociating and recombining the elemental reaction gases entering the deposition chambers into deposition species and compounds. These species and compounds are then deposited onto the bottom surface of the substrate 11 as semiconductor layers. The substrate 11 is maintained substantially flat by the plurality of rows of magnetic elements 50 which provide an attractive force urging the substrate 11 upwardly, out of its normal sagging path of travel.

To form the photovoltaic cell 10 illustrated in FIG. 1, an n-type amorphous semiconductor layer is deposited onto the substrate 11 in the dopant deposition chamber 28, an intrinsic amorphous semiconductor layer is deposited atop the n-type layer in the deposition chamber 30 and a p-type amorphous semiconductor layer is deposited atop the intrinsic layer in the deposition chamber 32. As a result, in the preferred embodiment, the apparatus 26 deposits at least three amorphous semiconductor layers onto the substrate 11 with the intrinsic layer deposited in deposition chamber 30 differing in composition from the layers deposited in deposition chambers 28 and 32 by the absence of at least one element which will be referred to as the dopant or doping species.

III. Severing the Semiconductor Device

As discussed previously, it is frequently desirable to sever the large area photovoltaic material produced in a process such as the continuous deposition process discussed with reference to FIG. 2 into smaller area photovoltaic cells. Heretofore, severing processes were fairly complex because of the necessity of avoiding the creation of short circuit current paths by the cutting process. The device of the present invention, which is illustrated with reference to FIGS. 3 and 4, is readily severable into smaller cells.

Referring now to FIGS. 3 and 4, there is illustrated a photovoltaic cell 10' capable of being severed into a plurality of smaller cells. The cell 10' is generally similar to the photovoltaic cell 10 illustrated with reference to FIG. 1; however, for purposes of simplicity, various semiconductor layers thereof are collectively referred to herein as a semiconductor body 54, it being understood that this body 54 is representative of any semiconductor body. The photovoltaic cell 10' of FIGS. 3 and 4 also includes a substrate 11 generally similar to those previously described as well as a top electrode layer 22 also as previously described.

Photovoltaic cell 10' further includes a containment layer 56 formed of transparent, polymeric material which is disposed atop the top electrode 22 to permit the photovoltaic cell 10' to be severed into a plurality of smaller cells. By depositing containment layer 56 in a pattern including a plurality of regions 58, such as are shown in FIG. 3, the cell 10' may easily be severed into a plurality of smaller cells by severing the cell 10' through the regions 58 of containment layer 56 as depicted. Of course, containment layer 56 may be deposited in a wide variety of patterns to permit cell 10' to be severed into a variety of smaller cells. In the particular pattern shown in FIG. 3, for example, the photovoltaic cell 10' could be cut into as many as 6 smaller cells. Alternatively, it could be deposited to entirely cover top electrode 22. The regions 58 of containment layer 56 serve to prevent top electrode 22 from forming shards as it is being severed, which shards can cause short circuiting with the substrate 11.

It has been found that, if the containment layer 56 is approximately 10 microns thick, it will effectively prevent the creation of such shards and subsequent short circuiting during the severing operation. Preferably, the containment layer 56 is formed of a somewhat flexible polymeric material, such as ethylene vinyl acetate, polycarbonate, cellulose acetate, polystyrene, polyurethane, polyvinylchloride, polyvinyl acetate, acrylic resins, and mixtures and combinations thereof. The containment layer can be applied by inexpensive production processes, such as by roll-to-roll screen printing.

It should be noted that the instant invention may be practiced otherwise than illustrated herein. For example, top electrode materials other than TCO materials may be similarly employed. Furthermore, while the discussion is primarily oriented toward severing photovoltaic cells, the instant invention may be practiced with any type of semiconductor device in which the electrode material behaves in a manner similar to the manner described for the TCO material and short circuiting must be prevented. For example, large area memory arrays, large area integrated circuits, large area liquid crystal displays and similar devices may be severed according to the principles of the instant invention. Also, the containment layer is shown in the figures as deposited atop the top electrode. In certain circumstances, it may be deposited atop the bottom electrode or on the bottom side of either electrode. Furthermore, while the discussion herein primarily concerns the cutting of devices with metallic substrates, the instant invention is not so limited but may be practiced with devices having substrates of synthetic polymers, ceramics and the like provided they have at least one electrically conductive base electrode region thereon communicating with the semiconductor body of the device and they are capable of being severed.

The foregoing drawings, description and discussion are meant to be illustrative of some particular embodiments of the instant invention. Doubtless, other variations of the described embodiments may occur to one skilled in the art without departing from the spirit of the present invention. It the claims that follow, including all equivalents thereof, which define the scope of the invention.

We claim:

1. A method of severing a semiconductor device into at least two smaller devices, said semiconductor device including a thin film semiconductor body sandwiched between a base electrode formed on a substrate and a transparent, electrically conductive top electrode formed of an at least partially light transmissive conductive material, said method including the steps of:

depositing a containment layer formed of polymeric material atop said top electrode on at least one region through which said device is to be severed to prevent formation of shards in the top electrode when the device is severed;

severing the device from the top electrode side thereof by first severing through the containment layer such that the containment layer cushions and contains the top electrode, thereby preventing the formation of top electrode shards and subsequent short circuiting of the device.

2. The method of claim 1 including the further step of depositing an approximately 10 microns thick containment layer.

3. The method of claim 1 wherein the containment layer is deposited from a material selected from the group consisting of: ethylene vinylacetate, polycarbonate, cellulose acetate, polystyrene, polyurethane, polyvinylchloride, polyvinylacetate, acrylic resins, and mixtures thereof.

4. The method of claim 1 comprising the further steps of depositing the containment layer atop the electrode in a plurality of regions, and successively severing the device through each of said plurality of regions to form at least three said smaller devices.

* * * * *